US007125128B2

(12) United States Patent
Novak

(10) Patent No.: US 7,125,128 B2
(45) Date of Patent: Oct. 24, 2006

(54) ADAPTIVE-OPTICS ACTUATOR ARRAYS AND METHODS FOR USING SUCH ARRAYS

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 59 days.

(21) Appl. No.: 10/765,703

(22) Filed: Jan. 26, 2004

(65) Prior Publication Data

US 2005/0162762 A1 Jul. 28, 2005

(51) Int. Cl.
 *G02B 5/08* (2006.01)
 *G02B 7/182* (2006.01)
 *G03B 27/54* (2006.01)
 *F15C 1/00* (2006.01)

(52) U.S. Cl. ............... 359/849; 359/846; 359/350; 355/67; 137/803

(58) Field of Classification Search ............... 359/350, 359/846, 848, 849, 358, 845; 355/67; 137/38, 137/598, 803
See application file for complete search history.

(56) References Cited

U.S. PATENT DOCUMENTS

| 3,603,671 A | * | 9/1971 | Brown ................. 359/849 |
| 3,620,606 A | * | 11/1971 | Tschunko ................. 359/849 |
| 4,003,640 A | * | 1/1977 | Hansen ................. 359/849 |
| 4,190,327 A | * | 2/1980 | Hughes ................. 359/845 |
| 4,492,431 A | * | 1/1985 | Eitel et al. ................. 359/849 |
| 4,632,523 A | * | 12/1986 | Knohl ................. 359/848 |
| 4,721,376 A | * | 1/1988 | Fushchetto ................. 359/845 |
| 4,825,062 A | * | 4/1989 | Rather et al. ............. 250/201.1 |
| 4,923,302 A | * | 5/1990 | Ealey et al. ................. 356/601 |
| 5,151,809 A | * | 9/1992 | Meier ................. 359/846 |
| 5,204,784 A | * | 4/1993 | Spinhirne ................. 359/849 |
| 5,461,514 A | * | 10/1995 | Sasaki et al. ............... 359/848 |
| 6,236,490 B1 | | 5/2001 | Shen |
| 2004/0013956 A1 | | 1/2004 | Sogard |

FOREIGN PATENT DOCUMENTS

EP 1 376 191 A1 1/2004

OTHER PUBLICATIONS

John W. Hardy, "Active Optics: A New Technology for the Control of Light," IEEE, vol. 66, No. 6, Jun. 1978, pp. 651-697.

(Continued)

*Primary Examiner*—Ricky D. Shafer
(74) *Attorney, Agent, or Firm*—Klarquist Sparkman, LLP

(57) ABSTRACT

Actuator arrays for use in adaptive-optical elements and optical systems containing at least one such element are disclosed. The actuator arrays provide more precise control of the shape of the adaptive-optical surface while utilizing fewer actuators than conventional systems. An adaptive-optical system of an embodiment includes an array of force devices coupled to a deformable optical surface. The force devices of the array are arranged in braking groups and force-altering groups such that each force device belongs to a respective combination of braking group and force-altering group. A respective force controller is coupled to the force devices of each force-altering group, and a respective braking controller is coupled to the force devices of each braking group. The force-altering group adjusts as required the respective forces exerted on the optical surface by the force devices of the respective force-altering group, whereas the braking controller when actuated prevents changes in respective forces exerted by the force devices of the respective braking group.

23 Claims, 10 Drawing Sheets

OTHER PUBLICATIONS

Mark A. Ealey, "Active and Adaptive Optical Components: The Technology and Future Trends," SPIE, vol. 1543, Active and Adaptive Optical Components, 1991, pp. 2-34.

Mark A. Ealey, "Actuators: Design Fundamentals, Key Performance Specifications and Parametric Trades," SPIE vol. 1543, Active and Adaptive Optical Components, 1991, pp. 346-362.

Mark A. Ealey and John A. Wellman, "Deformable Mirrors: Design Fundamentals, Key Performance Specifications, and Parametric Trades," SPIE, vol. 1543, Active and Adaptive Optical Components, 1991, pp. 36-51.

Julie A. Perreault et al., "Adaptive Optic Correction Using Microelectromechanical Deformable Mirrors," Optical Engineering, vol. 41, No. 3, Mar. 2002, pp. 561-566.

D.A. Tichenor et al., "EUV Engineering Test Stand," 25th Annual International Symposium on Microlithography, Feb. 14, 2000, 22 pages.

L.C. Hale et al., "High-NA Camera for an EUVL Microstepper," 15th Annual American Society for Precision Engineering, Scottsdale, Sep. 1, 2000, 6 pages.

* cited by examiner

ADAPTIVE-OPTICS ACTUATOR ARRAYS AND METHODS FOR USING SUCH ARRAYS

FIELD

This disclosure pertains generally to the field of adaptive-optics systems and adaptive-optical elements used in adaptive-optics systems. Certain embodiments of the disclosure pertain to lithography systems utilizing adaptive optics.

BACKGROUND

An adaptive-optical element typically is configured to have a deformable reflective surface to control and shape a wavefront of light reflected from the surface. Typically, adaptive-optical elements are used to improve the optical resolution of a particular optical system by compensating for fabrication errors (e.g., misshapen or thermally deformed elements) or optical-path aberrations (e.g., atmospheric effects). Such optical elements and systems comprising them achieve this improved performance by shaping the deformable surface in such a way that unwanted aberrations in the incident wavefront are removed. Hence, adaptive-optical elements (e.g., mirrors) are of great interest for use in astronomical telescopes (especially earth-bound telescopes) subject to image-degrading effects caused, for example, by passage of starlight through the earth's atmosphere.

Another area in which interest in adaptive optics is increasing rapidly is optical lithography, especially extreme ultraviolet (EUV) lithography (EUVL) in which all the optical elements used for illumination and image projection are reflective. The performance of an EUVL system can be degraded substantially by manufacturing errors in one or more of the reflective-optical elements such as used in the projection-optical system. Other sources of image degradation include thermally induced deformations in illuminated regions of the lithography systems, vibrations, and image-placement errors and/or distortion errors that occur during lithographic pattern transfer. In a conventional EUVL system utilizing adaptive optics, at least one optical element of the system is configured with a deformable mirror surface. Deformation of the mirror surface is achieved in a controlled manner by an array of actuators that are controlled and energized independently. Unfortunately, the number of individual actuators required for satisfactory performance tends to be quite large, resulting in an excessively crowded array of actuators associated with the mirror. This crowding tends to limit the area of the mirror surface that can be controlled and/or the resolution with which controlled deformation can be achieved. Moreover, because of the relatively high number of individual actuators utilized, conventional actuator arrays for use in these mirrors tend to be very expensive. Accordingly, there is a need for improved actuator arrays for use in adaptive-optical systems.

SUMMARY

In view of the shortcomings of the conventional systems as summarized above, the present disclosure provides, inter alia, adaptive-optical systems having improved actuator arrays and methods for using the improved actuator arrays. The disclosed actuator arrays allow for more precisely controlled deformations of an optical surface while utilizing fewer actuators than required by conventional systems to achieve a desired level of optical performance.

Adaptive-optical systems are provided that include an array of force devices coupled to a deformable optical surface (e.g., a deformable mirror). The array of force devices is configured to exert, in a selective manner, forces on the optical surface that deform the optical surface into a desired shape. In one embodiment, the force devices of the array are arranged into rows (as exemplary braking groups) and columns (as exemplary force-altering groups) such that each force device is a member of a designated respective braking group and a designated respective force-altering group. This system further includes a force controller that is coupled to the force devices of a respective force-altering group, and a braking controller that is coupled to the force devices of a respective braking group. The force controller is configured to adjust the force delivered by the force devices of the respective force-altering group, whereas the braking controller is configured to prevent any change in the force exerted by the force devices of the respective braking group whenever the braking controller is activated. The braking controller can be, for example, a pneumatically actuated, cam-actuated, or magnetically actuated brake. Other suitable braking mechanisms alternatively can be utilized.

In certain embodiments utilizing a magnetically actuated brake, for example, the brake desirably includes a magnetizable pathway extending through at least a subset of the force devices and the array body. The magnetizable pathway can be formed of a magnetizable material (e.g., iron), whereas other portions of the force devices and of the array body can be formed of a non-magnetizable material (e.g., aluminum). A magnetic-field source (e.g., a solenoid or permanent magnet) can be coupled magnetically to the magnetizable pathway and configured to create a magnetic field within the magnetizable pathway that creates a force on the force devices of a respective braking group, so as to prevent further movement or adjustment of the force devices. For example, a force substantially normal to the respective operational axes of the force devices can be created that prevents further movement or adjustment of the respective force devices.

The adaptive-optical system further can include a sensor configured to detect and measure at least one optical characteristic of the deformable optical surface and an array controller coupled to the sensor, the force controllers, and braking controllers of the array. The array controller can be configured to determine the desired shape of the optical surface based on measurements from the sensor and to adjust the force controllers and braking controllers to achieve the desired shape.

Also provided are adaptive-optical systems that are similar to the systems summarized above. In embodiments of these systems a force controller is coupled to a first set of force devices and a braking controller is coupled to a second set of force devices. The force controller can be configured to adjust a force exerted by the force devices in the first set, whereas the braking controller can be configured to activate a braking mechanism that prevents further movements of the force devices in the second set. In some embodiments, all the force devices are coupled to respective force controllers and respective braking controllers. In certain embodiments, no two force devices are coupled to the same pair of force controller and braking controller.

The force devices can comprise bellows that are configured to be pressurized with a fluid. The bellows can be pressurized by a valve portion of the corresponding force controller. The force controller alternatively can comprise a cam that is operably coupled to the respective force devices. The braking controller can comprise any of the mechanisms described above (e.g., pneumatically actuated brake mechanism, cam-actuated brake mechanism, or magnetically actuated brake mechanism) as well as any other suitable mechanism.

Also provided are force devices for an adaptive-optical element, wherein the force devices utilize a magnetic braking mechanism. An embodiment of such a force device includes a movable member coupled to a respective locus on a deformable mirror surface. The movable member includes a first magnetizable portion formed from a magnetizable material (e.g., iron) and a sleeve surrounding the movable member and defining a space in which the movable member moves relative to the sleeve. The sleeve also defines an operational axis along which the movable member moves and further includes at least a second magnetizable portion formed from the magnetizable material. The magnetizable portions of the movable member and of the sleeve collectively form a magnetic-flux pathway that is substantially normal to the operational axis of the force device. The force device can further include a magnetic-field source (e.g., a permanent magnet or solenoid) configured to create, in a selective manner, a magnetic field in the magnetic-flux pathway. In certain embodiments, the movable member is a piston and the sleeve is an enclosing cylinder. In certain other embodiments, the force device further includes a pressurizable bellows coupled to the movable member. The magnetic pathway can include a return path, desirably including a magnetizable plug, magnetically coupled to the magnetic-flux pathway. In some embodiments, the magnetizable material exhibits a hysteresis sufficient to maintain the magnetic field in the magnetic-flux pathway for a time after de-energizing the magnetic-field source.

Also provided are methods for adjusting the optical surface of an adaptive-optical system. An embodiment of such a method includes unlocking a row (or other braking group) of force devices coupled to respective loci on a deformable mirror surface, adjusting the forces exerted on the mirror surface by the respective force devices in the braking group, and then locking the braking group of force devices to prevent changes in the forces exerted by the force devices in the braking group. The method further can include adjusting the forces exerted by the force devices in the braking group to previous levels before unlocking the braking group. The method also can include selecting the braking group of force devices (e.g., based on detected or pre-determined optical characteristics of a mirror surface or on a predetermined pattern). In some embodiments, unlocking and locking are performed using a single braking controller. In certain other embodiments, unlocking includes deactivating a magnetic brake that locks the braking group of force devices.

Also provided are methods for adjusting an optical surface in an adaptive optical system. An embodiment of such a method includes providing a row (or other braking group) of force devices coupled to respective loci on a deformable optical surface, adjusting the forces exerted on the optical surface using force controllers coupled to respective force devices of the braking group, and then locking the braking group of force devices by inducing a magnetic field in at least a subset of the force devices. The magnetic field operates to prevent further adjustment of the force devices irrespective of changes in the force controllers. The additional features or modifications described above with respect to the previous method similarly can be included with this method.

Also provided are lithography apparatus utilizing any of the disclosed adaptive optical systems, force devices, or methods. Such a lithography apparatus can be, for example, an extreme ultraviolet lithography (EUVL) apparatus used for fabricating microelectronic devices.

The foregoing and additional features and advantages of the disclosed technology will be more readily apparent from the following detailed description, which proceeds with reference to the accompanying drawings.

DETAILED DESCRIPTION

The disclosed devices and methods are described below in connection with representative embodiments that are not intended to be limiting in any way. The present disclosure is directed toward novel and non-obvious features and aspects of the various embodiments of the adaptive-optics actuator arrays described below. The disclosed features and aspects can be used alone or in novel and non-obvious combinations and sub-combinations with one another.

Figure 1:
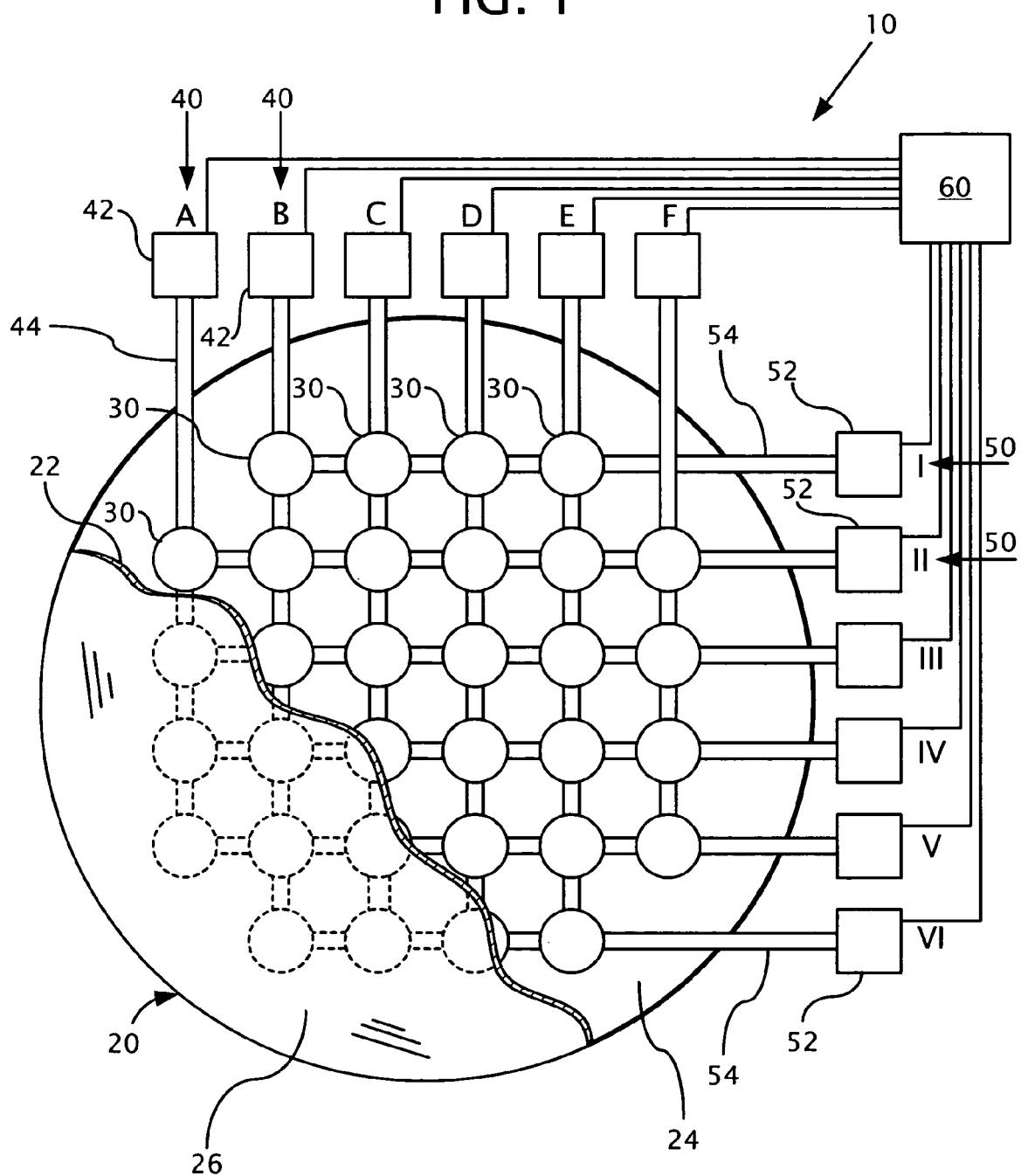
FIG. 1 is a schematic plan view of a first representative embodiment of an adaptive-optics actuator array.

FIG. 1 shows an adaptive-optics actuator array 10 according to a representative embodiment. A deformable mirror 20, (shown in FIG. 1 as having a reflective surface 26 partially cut away along a line 22) has a "bottom" surface 24 to which multiple force devices 30 are mounted. The force devices 30 in this embodiment are arranged in a two-dimensional array, namely into columns (as exemplary "force-altering groups") 40 and rows (as exemplary "braking groups") 50. For illustrative purposes, the force-altering groups 40 are designated alphabetically (A–F) and the braking groups 50 are designated numerically (I–VI).

In the embodiment of FIG. 1, each force device 30 in a respective force-altering group 40 is driven by a corresponding force controller 42 via a respective control path 44. Similarly, each force device 30 in a respective braking group 50 is controlled by a corresponding braking controller 52 along a respective brake path 54. Driving a force controller 42 yields a corresponding localized deformation of the reflective surface 26. The force devices 30 of a particular braking group 50 can be locked, or held, in a constant position by the corresponding braking controller 52. Exemplary braking controllers 52 are motor-driven cams and pneumatic valves. As more fully described below, the braking controllers 52 when actuated serve to prevent any change in the force delivered by the force devices 30 in their respective braking groups 50 to respective locations on the reflective surface 26. Thus, whenever a braking controller 52 is in an activated state, the force devices 30 in the corresponding braking group 50 are prevented from changing the respective forces being delivered thereby to the reflective surface 26, regardless of the states or settings of the corresponding force controllers 42.

In one particular embodiment, the individual force-altering groups 40 and braking groups 50 of the actuator array 10 are individually controllable. That is, each force controller 42 controls the force devices 30 in a respective force-altering group 40, and each braking controller 52 locks the force devices 30 in a respective braking group 50. Consequently, by selectively unlocking one or more braking groups and selectively actuating one or more force controllers 42, the force devices 30 of the actuator array 10 are controlled and adjusted individually. In contrast to conventional systems, the number of force controllers 42 used in this embodiment is fewer than the number of force devices 30, and hence less than the number of loci on the reflective surface 26 that are movable.

Figure 2:
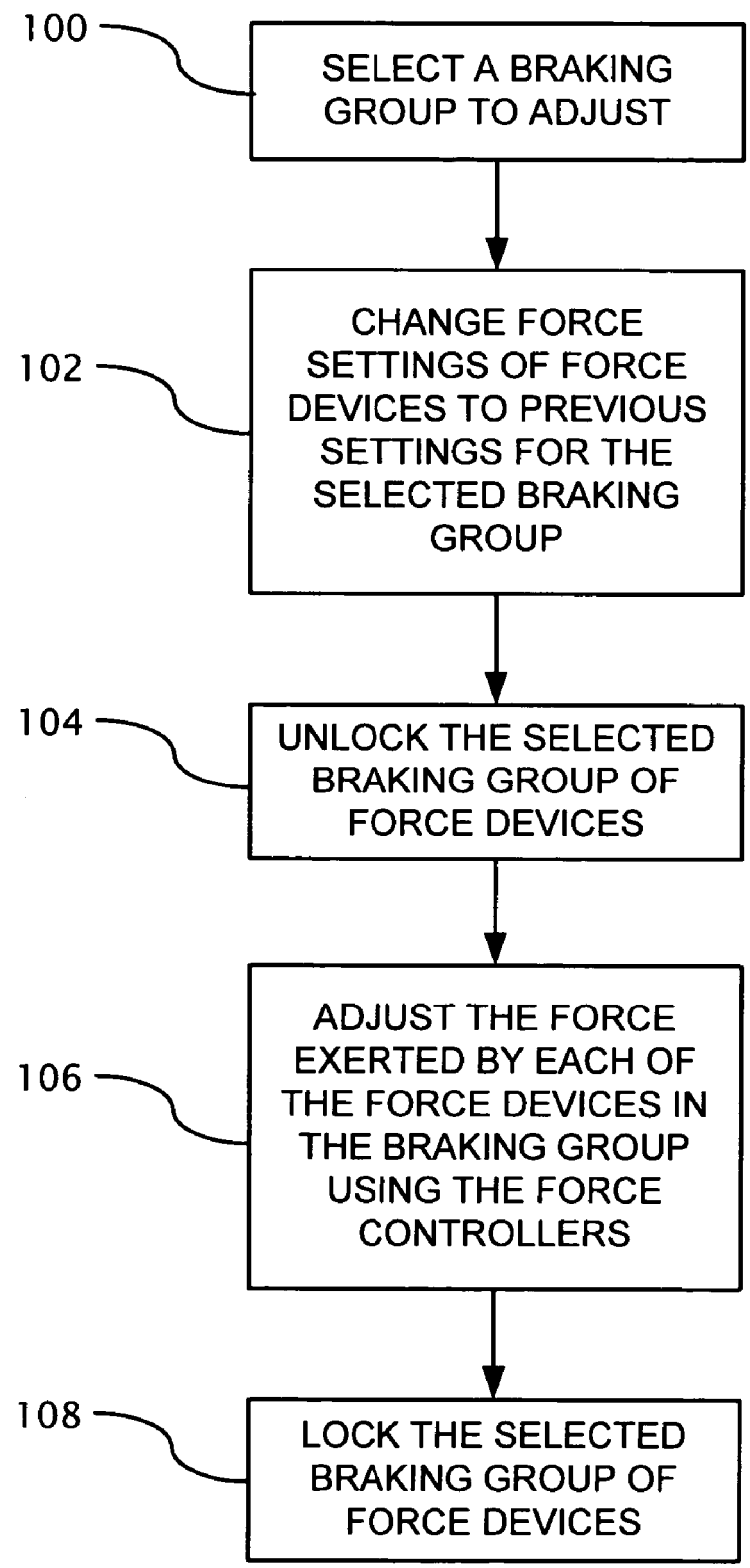
FIG. 2 is a flowchart illustrating a method of operating the adaptive-optics actuator array of FIG. 1.

FIG. 2 is a flowchart illustrating one exemplary method for operating the actuator array 10. At process block 100, a braking group of force devices is selected for adjustment. The braking group to be adjusted can be selected according to a known pattern (e.g., consecutive rows) or based on some other feedback (e.g., a sensor system that measures optical characteristics of the reflective surface 26). At process block 102, the settings of the force devices 30 in the selected braking group are set to match the previous values for the braking group. As a result, when the selected braking group is unlocked, the constituent force devices 30 do not experience an immediate change. (An immediate change could create a shock in a force device or in the mirror 20 that eventually could cause excessive wear of the internal components of the actuator array 10 or of the mirror 20, or may cause other undesirable effects.) In some implementations, however, the step in process block 102 is not performed; hence, this step is optional. At process block 104, the braking controller 52 of the selected braking group is deactivated to unlock the force devices 30 in the selected braking group, thereby enabling the respective forces applied by the force devices 30 within the selected braking group to be changed as desired. At process block 106, the respective forces exerted on the surface 26 by each of the force devices 30 are adjusted by corresponding actuations of the force controllers 42. Depending on the profile of actuation, one, some, or all of the force devices 30 in the selected braking group can be adjusted in this manner. At process block 108, the braking controller 52 of the selected braking group is reactivated, and the respective force devices 30 are locked in their respective newly adjusted positions.

The exemplary method illustrated in FIG. 2 can be repeated as often as necessary for accurate and effective adjustment of the reflective surface 26 of the mirror 20. In certain implementations, the method of FIG. 2 is performed for each braking group 50 in the array 10 according to a predetermined pattern (e.g., first braking group, second braking group, third braking group, etc.). In other implementations, however, adjustments to a braking group 50 are made depending on instructions received by an array controller 60, which can prioritize actuations based on feedback received from, for example, a sensor (not shown).

Figure 3:
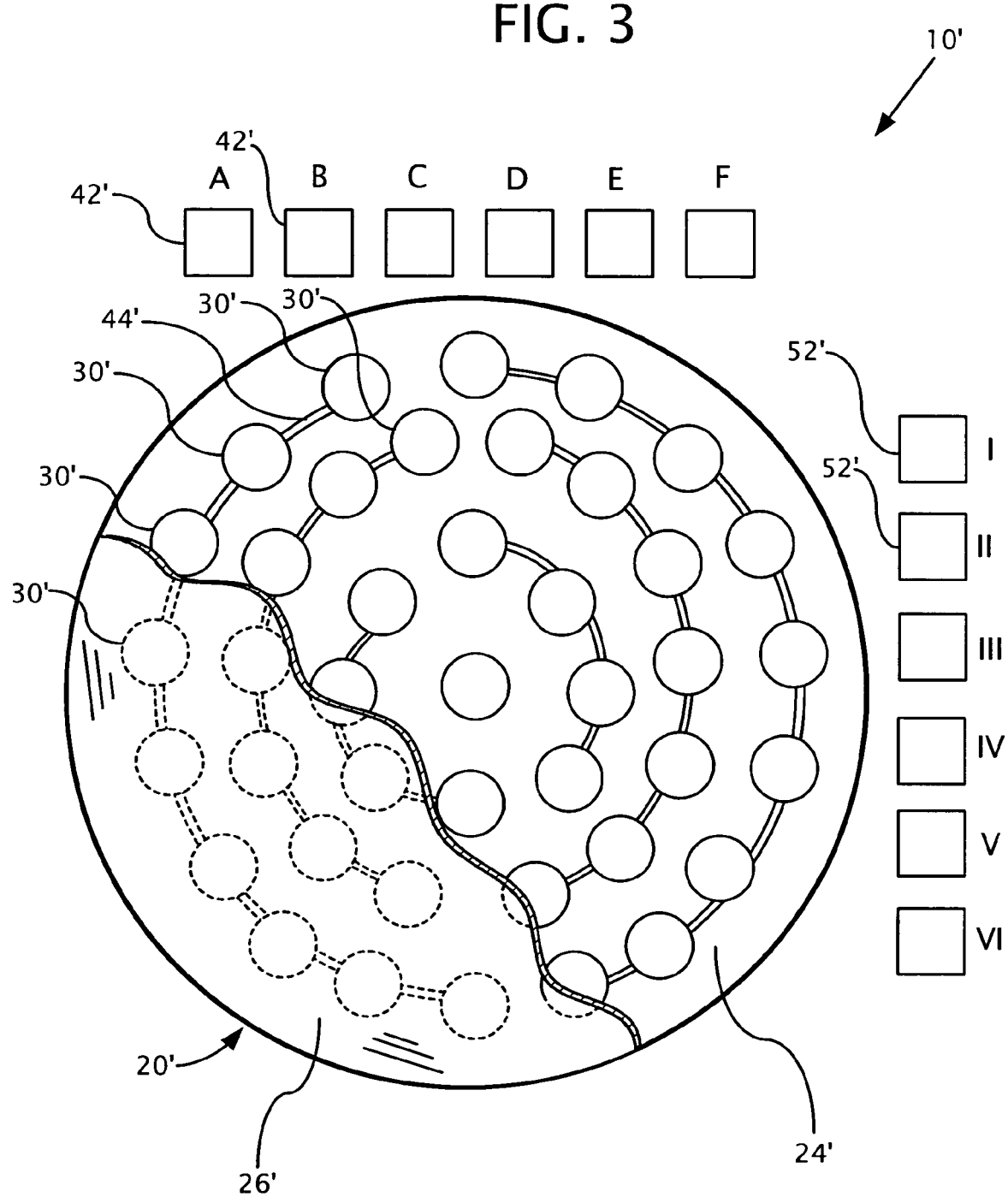
FIG. 3 is a schematic plan view of a second representative embodiment of an adaptive-optics actuator array.

The particular arrangement shown in FIG. 1 is not intended to be limiting in any way. Instead, the arrangement in which lockable force devices 30 are connected to their corresponding force controllers 42 and braking controllers 52, and the geometric arrangement of the force devices 30 with respect to the bottom surface 24 of the mirror 20 can vary widely from implementation to implementation. For example, the respective loci at which the lockable force devices 30 are coupled to the reflective surface 26 can depend on the shape of the mirror 20 or on the application in which the mirror is used. Similarly, the manner in which the lockable force devices 30 are divided into force-altering groups 40 and braking groups 50 (e.g., columns and rows, which terms that are used for illustrative purposes only and generally describe any two dimensions along which the force devices are arrayed) can vary depending on the shape of the mirror 20 and the application in which the mirror is used. For instance, FIG. 3 shows one possible alternative arrangement for an actuator array 10'. In FIG. 3, lockable force devices 30' controllably deform the reflective surface 26' of the mirror 20'. In FIG. 3 the force devices 30' generally are distributed in concentric circles along a "bottom" surface 24' of the mirror 20', thereby allowing substantially even control by the force devices 30' of the entire surface 26' of the mirror 20'. Other actuator-array patterns include, but are not limited to, square zonal arrays and hexagonal modal arrays. The force devices 30' in FIG. 3 are controlled by control paths 44', which generally are arranged concentrically in this embodiment. For illustrative purposes, the control paths 44' are not shown coupled to respective force controllers 42'. The force devices 30' are further coupled to brake paths, which are not shown in FIG. 3 for ease of illustrating the exemplary arrangement. The brake paths can be coupled to respective force devices 30' in a manner similar to FIG. 1 such that no two lockable force devices 30' along a particular brake path 54' are controlled using the same pair of force controller 42' and braking controller 52'.

The deformable mirrors 20, 20' shown in FIGS. 1 and 3, respectively, can be any of various types of mirrors or optical surfaces suitable for use in an adaptive-optical system. For example, the mirrors 20, 20' can be deformable thin-plate mirrors, segmented mirrors, monolithic mirrors (e.g., monolithic piezoelectric mirrors), membrane mirrors (e.g., electrostatically driven membrane mirrors), or any other such suitable mirrors or optical surfaces (including optical surfaces of lenses). Similarly, the reflective surfaces 26, 26' of the mirrors 20, 20', respectively, can be manufactured from a wide variety of materials depending on the particular application in which the adaptive optical system is used. For example, the reflective surfaces 26, 26' of the mirrors 20, 20', respectively, can comprise a material having a low elastic modulus, a low thermal-expansion coefficient, high microyield strength, and/or high resiliency to high-cycle fatigue. Exemplary materials are aluminum, beryllium, cer-vit, copper, molybdenum, nickel, silicon, silicon carbide, ULE glass, Zerodur (®, Schott), or any other such suitable material.

Figure 4:
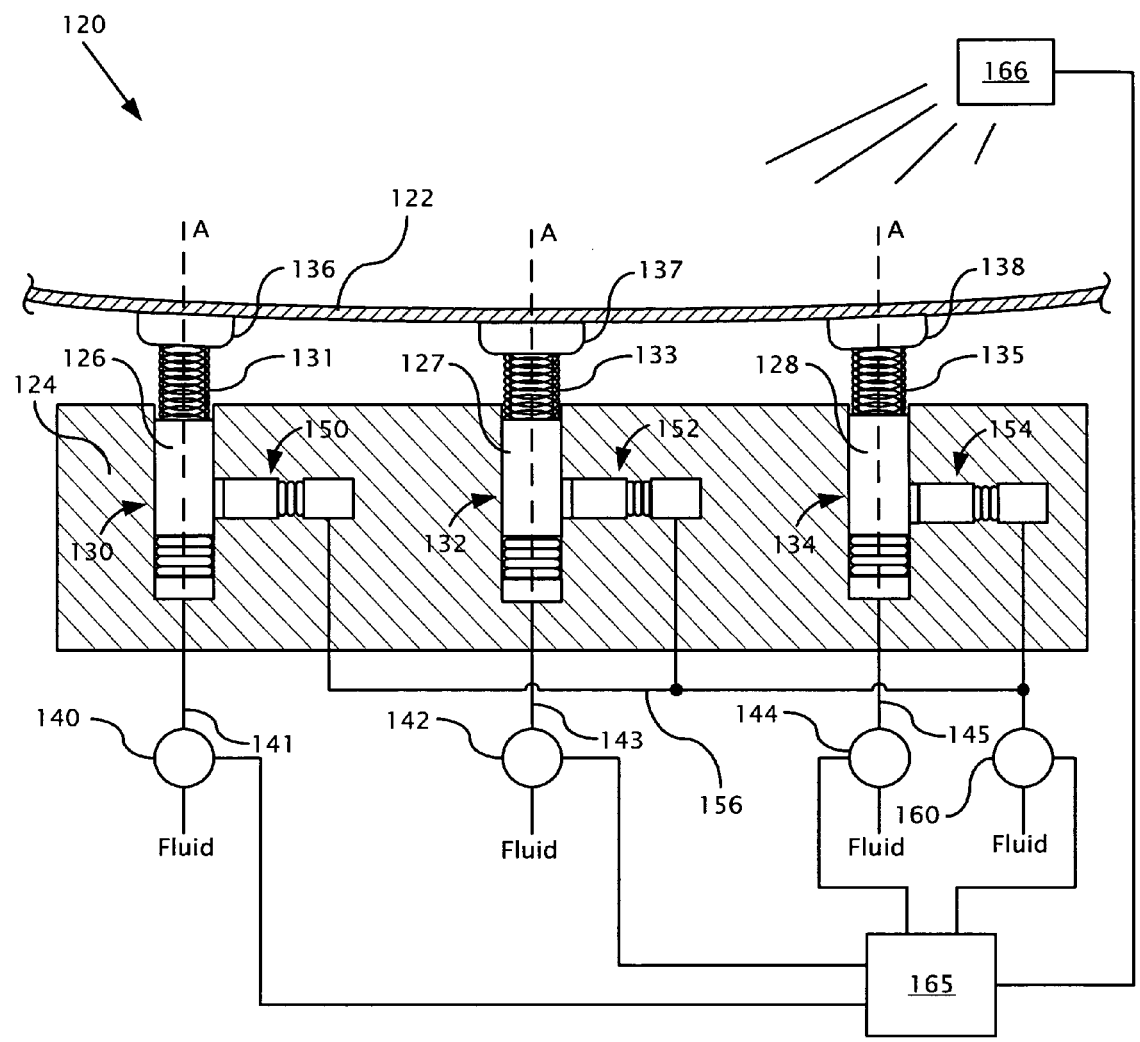
FIG. 4 is a schematic block diagram illustrating a first exemplary force controller and braking controller for the disclosed adaptive-optics actuator array.

A variety of force controllers and braking controllers can be used in any of the disclosed adaptive-optics actuator arrays. For example, FIG. 4 schematically illustrates a first exemplary actuator array 120 that utilizes pneumatic forces in the force controllers and braking controllers. In FIG. 4, three exemplary lockable force devices 130, 132, 134 apply respective forces to respective loci on a mirror surface 122. In the illustrated embodiment, each lockable force device 130, 132, 134 comprises a respective movable member 126, 127, 128 situated within a respective bore of an array body 124. The movable members 126, 127, 128 are configured to apply, when activated, respective forces to the mirror surface 122 along respective operational (or "movement") axes A via respective springs 131, 133, 135. (The springs 131, 133, 135 are especially advantageous for controlling large thin-plate mirrors.) The springs 131, 133, 135 can be coupled to the mirror surface via adhesive bonds 136, 137, 138, allowing the movable members 126, 127, 128 to "pull" on the mirror surface 122 as well as "push" the mirror surface. The particular manner in which the movable members 126, 127, 128 are coupled to the mirror surface 122 shown in FIG. 4, however, is not limiting. Alternatively, a number of other configurations are possible (e.g., direct connections not involving adhesive bonds). As discussed above, each of the lockable force devices 130, 132, 134 is independently controllable by a respective force controller and respective braking controller. In the embodiment illustrated in FIG. 4, for example, the force controllers comprise respective valves 140, 142, 144 that can be actuated individually to deliver, via respective conduits 141, 143, 145, fluid to or release fluid from the respective force devices 130, 132, 134. In this manner, the magnitude and direction of force delivered locally to respective loci on the mirror surface 122 by the movable members 126, 127, 128 are controlled and adjusted independently.

The braking mechanism in the embodiment illustrated in FIG. 4 includes braking pistons 150, 152, 154 that are positioned within respective bores, or cylinders, of the array body 124. The braking pistons 150, 152, 154 are configured such that, whenever a fluid pressure is applied thereto via a conduit 156, the braking pistons engage the respective movable members 126, 127, 128 of the respective force devices 130, 132, 134, thereby locking the movable members in place. For example, whenever the braking pistons 150, 152, 154 are actuated, they can engage the respective movable members 126, 127, 128 frictionally and force the movable members against a side of the respective bores or cylinders in which they operate, thereby preventing further movement of the movable members. The tolerances with which the movable members 126, 127, 128 and the corresponding bores or cylinders of the array body 124 are manufactured desirably are established such that no significant lateral movement or distortion is imparted to the movable members 126, 127, 128 by the braking pistons 150, 152, 154, respectively. As seen in FIG. 4, the braking pistons 150, 152, 154 are coupled together hydraulically via the common conduit 156, which is hydraulically controlled by a brake valve 160.

The number and arrangement of lockable force devices 130, 132, 134 shown in FIG. 4 is for illustrative purposes only and is not intended to be a limitation on the disclosed technology. Instead, the number and arrangement of force devices can vary depending upon the particular adaptive-optics system in which they are used. Further, the force controllers (the valves 140, 142, 144) of FIG. 4 can be coupled to additional force devices not shown in FIG. 4. For example, as was illustrated in FIGS. 1 and 3, the force controllers can be coupled to additional force devices to form multiple force-altering groups (e.g., columns) in the array 120.

Actuation of the force devices 130, 132, 134 can be controlled by an array controller 165 connected to and configured to receive optical data from a sensor 166. Based on the optical data from the sensor 166, the array controller 165 generates and routes appropriate control signals to each of the valves 140, 142, 144, 160 so as to cause appropriate respective actuations and braking of the force devices 130, 132, 134. Thus, the shape of the mirror surface 122 is controlled in real-time using feedback control. This general manner of feedback control can be used with any of the other embodiments disclosed herein.

Figure 5:
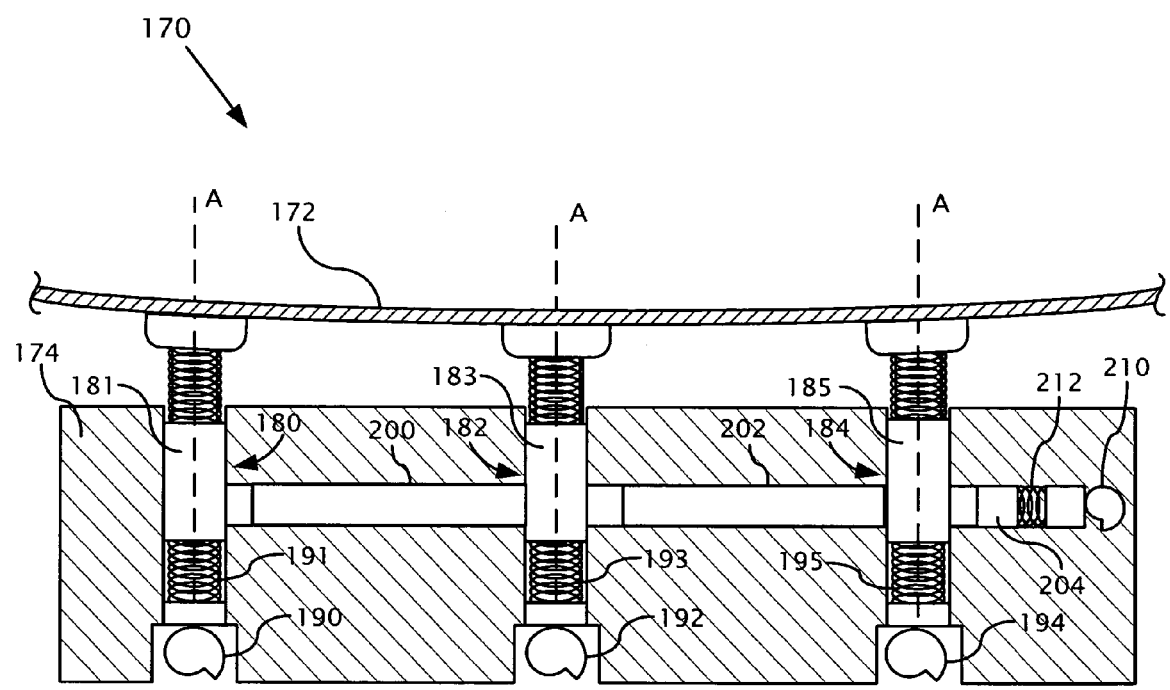
FIG. 5 is a schematic block diagram illustrating a second exemplary force controller and braking controller for the disclosed adaptive-optics actuator array.

FIG. 5 schematically illustrates a second exemplary array 170 that utilizes cam-actuated forces in the force controllers and braking controllers. The embodiment illustrated in FIG. 5 is substantially similar to the array 120 in FIG. 4, but uses forces controllably applied by respective cams to actuate movable members in the lockable force devices as well as the braking mechanisms. In particular, each of the force devices 180, 182, 184 comprises a respective movable member 181, 183, 185 situated in and movable relative to a respective bore in an array body 174. Each movable member 181, 183, 185 is independently movable in a controllable manner by a respective force controller comprising a respective cam 190, 192, 194. The cams 190, 192, 194 are coupled to the respective movable members 181, 183, 185 via respective springs 191, 193, 195, which enable the cams to be fully actuated without damage, even when the braking mechanism (described below) is engaged.

The braking mechanism in the embodiment of FIG. 5 comprises braking pistons 200, 202, 204 that are positioned within respective bores of the array body 174. A brake cam 210 engages the braking pistons 200, 202, 204. The braking pistons 200, 202, 204 are dimensioned and arranged so that, whenever the brake cam 210 is actuated, the braking pistons 200, 202, 204 engage the respective movable members 181, 183, 185 and thereby lock the force devices 180, 182, 184 in place. For example, whenever the braking pistons 200, 202, 204 are actuated, they frictionally engage the respective movable members 181, 183, 185 and force them against the sides of their respective bores, thereby preventing further movement of the movable members. The cam 210 can deliver the braking force through a spring 212, as illustrated in FIG. 5, or other suitable mechanism, or alternatively can contact the braking pistons 200, 202, 204 directly. As with the embodiment of FIG. 4, the tolerances with which the movable members 181, 183, 185 and the corresponding sleeves or cylinders of the array body 174 in which they operate desirably are established such that no significant vertical movement or distortion is imparted to the movable members by the braking pistons.

The arrays illustrated in FIGS. 4 and 5 should not be construed as being limiting in any way. Instead, the arrays of the present disclosure can be constructed using any one of a number of different actuating and braking mechanisms or any combination or subcombination of such mechanisms. For example, the force controllers and lockable force devices can be, but are not limited to, electromagnetic actuators, (e.g., voice-coil motors), ferroic actuators (e.g., piezoelectric devices, magnetostrictive devices, electrostrictive ceramic devices, shape-memory-alloy thermal devices, bimetal-alloy thermal devices, paraffin-thermal devices), hydraulic actuators (e.g., bellows-type devices), or any of various other suitable actuators.

Figure 6:
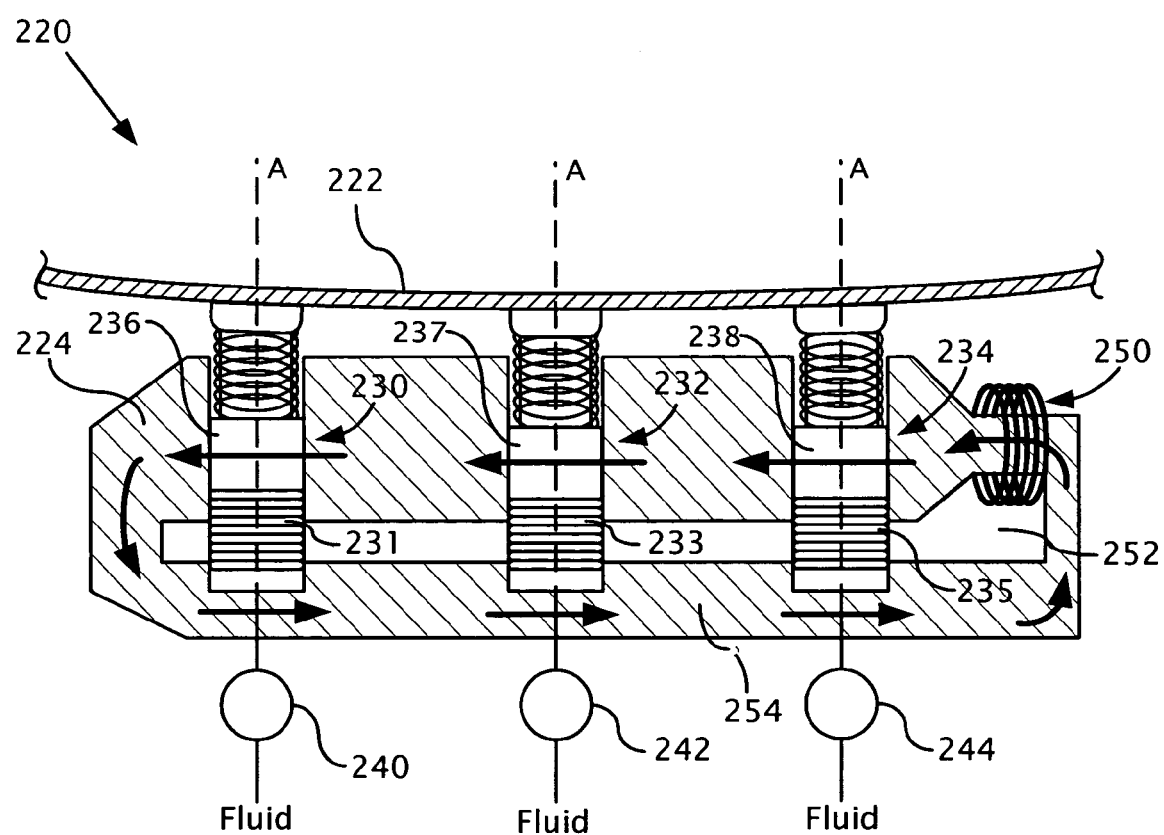
FIG. 6 is a schematic block diagram illustrating an exemplary magnetic-brake system for the disclosed adaptive-optics actuator array.
Figure 7:
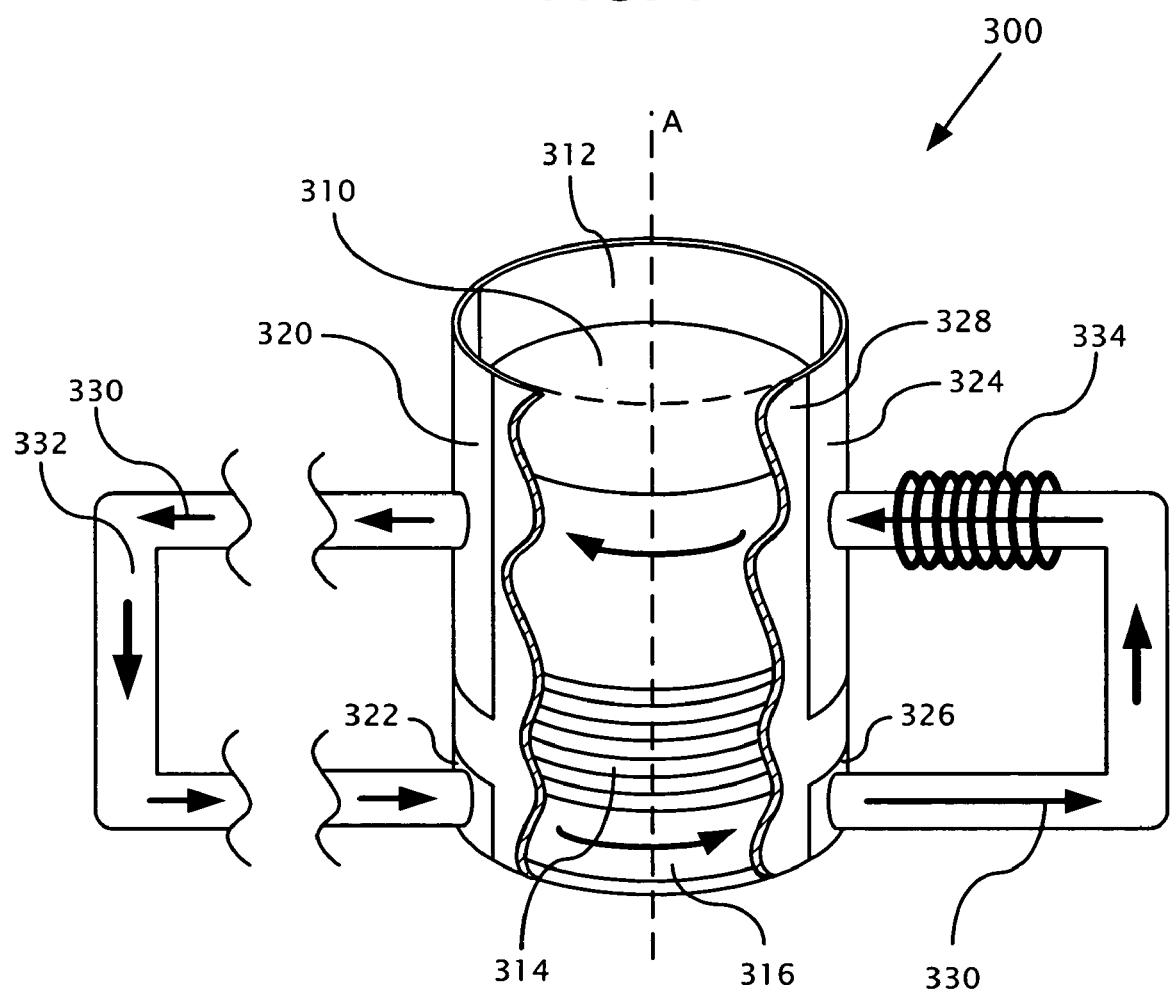
FIG. 7 is a schematic block diagram illustrating one of the force devices that can be used in the magnetic-brake system of FIG. 6.

Similarly, the arrays of the present disclosure alternatively can include any of various braking mechanisms other than those illustrated in FIGS. 4 and 5. In one particular embodiment, for example, a magnetic braking system is used. FIGS. 6–7 illustrate an exemplary embodiment of a magnetic braking system. FIG. 6 shows an exemplary array 220 utilizing a magnetic brake integrated into an array body 224. For illustrative purposes only, the shape of the mirror surface 222 in FIG. 6 is controllably manipulated by lockable pneumatic-force devices 230, 232, 234 comprising respective movable members 236, 237, 238. Movements of the movable members 236, 237, 238 in their respective bores in the array body 1224 are controlled by respective valves 240, 242, 244. The type of actuating force shown in FIG. 6 is not limiting, however, and any of the actuators described above in preceding embodiments, for example, can be utilized. In the embodiment of FIG. 6, the movable members 236, 237, 238 are at least partially formed of a magnetizable material (e.g., iron). The array body 224 can be formed at least partially of a magnetizable material (e.g., iron) whereas the remainder of the array body 224 is formed of a non-magnetizable material (e.g., aluminum). The magnetizable material of the movable members 236, 237, 238 and of the array body 224 desirably is situated so as to form a magnetic-flux pathway that can be magnetized by a magnetic-field source 250 (e.g., a solenoid or other field source).

In the array illustrated in FIG. 6, for example, the magnetic field source 250 creates a magnetic flux (shown by the bold arrows in FIG. 6) that flows through the magnetizable portions of the movable members 236, 237, 238 and of the array body 224, and returns along a path 254 "beneath" the force devices 230, 232, 234. A non-magnetic layer 252 can be formed in the array body 224 so as to define a magnetic-flux circuit. The non-magnetic layer 252 can be formed of a material having a low magnetic permeability (e.g., aluminum). Alternatively, the non-magnetic layer 252 can be an air space defined in the array body 224. Similarly, each force device 230, 232, 234 can include a respective non-magnetic layer, or portion, that helps define the magnetic-flux pathway in the array 220. For example, in the embodiment illustrated in FIG. 6, each force device 230, 232, 234 comprises a respective non-magnetic bellows portion 231, 233, 235 through which the magnetic flux does not flow.

The magnetic field created by the magnetic-field source 250 creates a magnetic force substantially normal to the operational axes A along which the respective force devices 230, 232, 234 operate. In certain embodiments, this magnetic force is sufficiently large to arrest motions of the movable members 236, 237, 238 regardless of the state or setting of the corresponding force controllers. For example, in FIG. 6, the magnetic force created by the magnetic-field source 250 desirably has sufficient magnitude to urge the magnetizable portions of the movable members 236, 237, 238 against the walls of the respective bores, regardless of the forces being exerted on the movable members 236, 237, 238 by the respective bellows 231, 233, 235 being pneumatically or hydraulically actuated by the respective valves 240, 242, 244.

FIG. 7 illustrates schematically an exemplary force device 300 and magnetic brake that can be used in the array 220 of FIG. 6. The force device 300 comprises a movable member 310 that operates within a sleeve 312 (shown partially cut away in FIG. 7). In the depicted embodiment, the movable member 310 is a piston, and the sleeve 312 is a cylinder or bore in which the piston 310 moves. The movable member 310 can be coupled to the mirror surface (not shown in FIG. 7, but see item 222 in FIG. 6) via any of various intermediate structures (e.g., a spring or unit of adhesive). The force device 300 illustrated in FIG. 7 further comprises a bellows 314 that is pressurized by a force controller (not shown) and that moves the movable member 310 along its operational axis A. The force device 300 further includes a plug 316 formed of a magnetizable material and positioned adjacent the bellows 314.

In the embodiment illustrated in FIG. 7, the sleeve 312 includes sleeve portions 320, 322, 324, 326 formed of a magnetizable material (e.g., iron). Another sleeve portion 328 is formed of a non-magnetizable material (e.g., aluminum). For example, the sleeve 312 can be manufactured with alternating regions of magnetizable and non-magnetizable material. The movable member 310 is similarly formed of a magnetizable material (e.g., iron) so as to provide a magnetic-flux pathway between the sleeve 312 and the movable member 310 regardless of the position of the movable member 310 within the sleeve 312. As shown schematically in FIG. 7, the magnetizable sleeve portions 320, 322, 324, 326 are coupled magnetically via a magnetic-flux pathway (illustrated by bold arrows 330) that can be formed, for example, by a magnetizable material within the array body 224. As shown at the left side of FIG. 7, the magnetic-flux pathway 330 can continue to other force devices 300 of the array 220 and eventually loop back through a connecting bar 332. The return portion of the pathway 330 can be located "beneath" the force device 300 and include the magnetic plug 316. A magnetic-field source 334 is magnetically coupled to the magnetic-flux pathway 330 and operates, when energized, to create a magnetic-field flux in the pathway. Whenever the magnetic field is being generated, a magnetic force is created between the movable member 310 and the sleeve 312 that urges and frictionally engages the movable member against the wall of the sleeve 312, thereby preventing any further movement of the movable member. Thus, the magnetic field operates as a brake, or locking mechanism, for the force device 300.

In certain embodiments, at least a portion of the magnetic-flux pathway 330 (e.g., the connecting bar 332) is formed of a high-hysteresis material exhibiting a strong residual magnetism. Thus, whenever the magnetic-field source 334 is energized, the magnetic-flux pathway 330 becomes magnetized and remains magnetized even after the magnetic-field source 334 is deactivated. To demagnetize the pathway 330, the magnetic-field source 334 can be energized with an A/C voltage having an amplitude that decreases over time. In certain other embodiments, the movable member 310 is in a locked position in the absence of a magnetic field, and the magnetic-field source 332 is energized to unlock the movable member 310. In yet other embodiments, a permanent magnet is included in the magnetic pathway and is used to produce a magnetic field that normally keeps the movable members locked, wherein the magnetic-field source 334 is used to cancel the magnetic field produced by the permanent magnet and thus unlock the movable members.

In still other embodiments, a permanent magnet is used as the magnetic-field source. The permanent magnet can be selectively moved into or out of the magnetic-flux pathway 330, thereby effectively increasing or decreasing the magnetic flux in the pathway 330. The permanent magnet can be moved, for example, using a positioning actuator (not shown). For instance, the positioning actuator can comprise one or more bellows or the like used for moving the permanent magnet into an actuating position by pressurizing the bellows, and for retracting the permanent magnet to a de-activating position by de-pressurizing the bellows. A detent effect can be included in the positioning actuator so that the permanent magnet will remain in either the actuating or de-actuating position without having to exert an additional force.

An array controller can be utilized in any of the embodiments described above. As discussed in connection with the embodiment of FIG. 4, the array controller can be configured to receive measurement data from a sensor, determine any adjustments to be made to the mirror surface based on the measurement data, and signal the force controllers and braking controllers to make the determined adjustments. The array controller can comprise a computer-based control system or can be an integrated circuit (e.g., an ASIC), programmable logic device (e.g., an FPGA), or other suitable control circuit. The array controller can be configured to control a single mirror or can be configured to control multiple mirrors or all the constituent mirrors of a particular optical system.

The sensor, if used, desirably is configured to detect and measure one or more of the optical characteristics of the mirror surface. These measurements can be provided continuously to the array controller, thereby creating a closed-loop, feedback-controlled, adaptive-mirror system capable of adjusting the mirror surface in real-time. Depending on the particular application for which the adaptive mirror is used, any of various sensors can be utilized. Candidate sensors include, but are not limited to, monochromatic-wavefront sensors (e.g., a Twyman-Green interferometer, a Mach-Zehnder interferometer, a phase-conjugate COAT system), narrow-band wavefront sensors (e.g., a Zernike phase-contrast sensor, a radial or lateral shearing interferometer), white-light wavefront sensors, Shack-Hartmann sensors, or indirect-wavefront measurement systems. Together, the array controller and the sensor can operate to adjust the mirror surface to compensate for various aberrations in the optical path (e.g., turbulent-atmosphere effects) or fabrication errors (e.g., misshapen or thermally deformed mirrors).

Although the foregoing description has been set forth largely in the context of the deformable optical surface being a reflective surface, such as of a mirror, this is not intended to be limiting. The deformable optical surface alternatively can be, for example, a surface of a lens.

Figure 8:
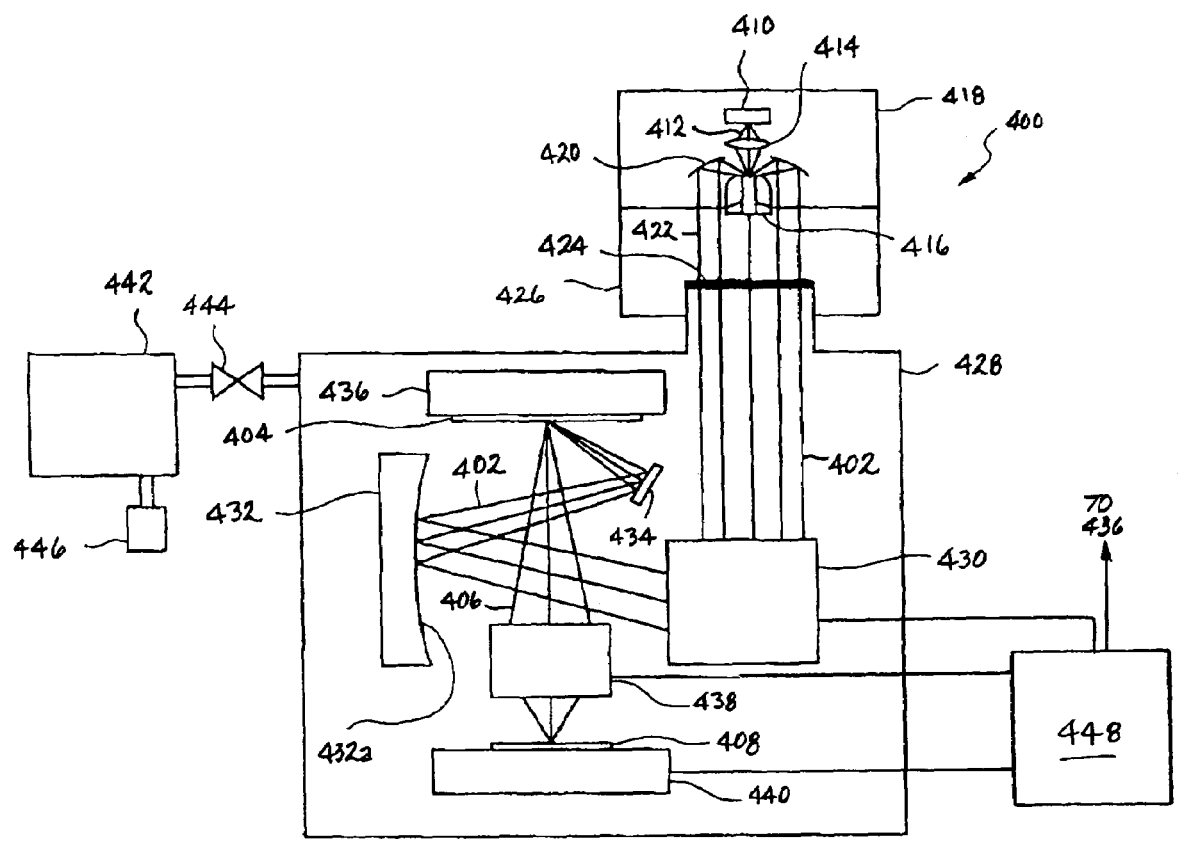
FIG. 8 schematically shows a lithographic-exposure apparatus that can incorporate any of the disclosed adaptive-optics actuator arrays.

An exemplary lithographic exposure system 400 with which any of the foregoing embodiments of adaptive-optical elements can be used is shown schematically in FIG. 8. Many of the components and their interrelationships in this system are known in the art, and hence are not described in detail herein.

The lithographic exposure system 400 is a projection-exposure system that performs step-and-scan lithographic exposures using light in the extreme ultraviolet ("soft X-ray") band, typically having a wavelength of in the range of $\lambda \approx 11$–14 nm (nominally 13 nm). Lithographic exposure involves directing an EUV illumination beam 402 to a pattern-defining reticle 404. The illumination beam 402 reflects from the reticle 404 while acquiring an aerial image of the pattern portion defined in the illuminated portion of the reticle. The resulting "patterned beam" 406 is directed to an exposure-sensitive substrate 408, which upon exposure becomes imprinted with the pattern.

To produce the illumination beam 402, a laser light source 410 is situated at the extreme upstream end of the system. The laser light source 410 produces a beam 412 of laser light having a wavelength in the range of infrared to visible. For example, the laser light source 410 can be a YAG or excimer laser employing semiconductor laser excitation. The laser light 412 emitted from the laser light source 410 is focused and directed by a condensing optical system 414 to a laser-plasma light source 416. The laser-plasma light source 416 can be configured, for example, to generate EUV radiation having a wavelength of $\lambda \approx 13$ nm.

A nozzle (not shown) is disposed in the laser-plasma light source 416, from which xenon gas is discharged. As the xenon gas is discharged from the nozzle in the laser-plasma light source 416, the gas is irradiated by the high-intensity laser light 412 from the laser light source 410. The resulting intense irradiation of the xenon gas causes sufficient heating of the gas to generate a plasma. Subsequent return of Xe molecules to a low-energy state results in the emission of EUV light from the plasma. Since EUV light has low transmissivity in air, its propagation path must be enclosed in a vacuum environment produced in a vacuum chamber 418. Also, since debris tends to be produced in the environment of the nozzle from which the xenon gas is discharged, the vacuum chamber 418 desirably is separate from other chambers of the system 400.

A paraboloid mirror 420, provided with, for example, a surficial multilayer Mo/Si coating, is disposed immediately upstream of the laser-plasma light source 416. EUV radiation emitted from the laser-plasma light source 416 enters the paraboloid mirror 420, and only EUV radiation having a wavelength of, for example, $\lambda \approx 13$ nm is reflected from the paraboloid mirror 420 as a coherent flux of EUV light 422 in a downstream direction (downward in the figure). The EUV flux 422 then encounters a pass filter 424 that blocks transmission of visible wavelengths of light and transmits the desired EUV wavelength. The pass filter 424 can be made, for example, of 0.15 nm-thick beryllium (Be). Hence, only EUV radiation (the illumination beam 402) having the desired wavelength is transmitted through the pass filter 424. The area around the pass filter 424 is enclosed in a vacuum environment inside a chamber 426.

An exposure chamber 428 is situated downstream of the pass filter 424. The exposure chamber 428 contains an illumination-optical system 430 that comprises at least a condenser-type mirror and a fly-eye-type mirror. The illumination beam 402 from the pass filter 424 is shaped by the illumination-optical system 430 into a circular flux that is directed to the left in the figure toward an X-ray-reflective mirror 432. The mirror 432 has a circular, concave reflective surface 432*a*, and is held in a vertical orientation (in the figure) by holding members (not shown). The mirror 432 comprises a substrate made, e.g., of quartz or low-thermal-expansion material such as Zerodur (Schott). The reflective surface 432*a* is shaped with extremely high accuracy and coated with a Mo/Si multilayer film that is highly reflective to EUV light. Whenever EUV light having a wavelength in the range of 10 to 15 nm is used, the multilayer film on the surface 432*a* can include a material such as ruthenium (Ru) or rhodium (Rh). Other candidate materials are silicon, beryllium (Be), and carbon tetraboride ($B_4C$).

A bending mirror 434 is disposed at an angle relative to the mirror 432 to the right of the mirror 432 in the figure. The reflective reticle 404, that defines a pattern to be transferred lithographically to the substrate 408, is situated "above" the bending mirror 434. Note that the reticle 404 is oriented horizontally with the reflective surface directed downward to avoid deposition of any debris on the surface of the reticle 404. The illumination beam 402 of EUV light emitted from the illumination-optical system 430 is reflected and focused by the mirror 432, and reaches the reflective surface of the reticle 404 via the bending mirror 434.

The reticle 404 has an EUV-reflective surface configured as a multilayer film. Pattern elements, corresponding to pattern elements to be transferred to the substrate (or "wafer") 408, are defined on or in the EUV-reflective surface. The reticle 404 is mounted on a reticle stage 436 that is operable to hold and position the reticle 404 in the X- and Y-axis directions as required for proper alignment of the reticle relative to the substrate 408 for accurate exposure. The reticle stage 436 also desirably is operable to rotate the reticle 404 as required about the Z-axis. The position of the reticle stage 436 is detected interferometrically in a manner known in the art. Hence, the illumination beam 402 reflected by the bending mirror 434 is incident at a desired location on the reflective surface of the reticle 404.

A projection-optical system 438 and the substrate 408 are disposed downstream of the reticle 404. The projection-optical system 438 comprises several EUV-reflective mirrors. The patterned beam 406 from the reticle 404, carrying an aerial image of the illuminated portion of the reticle 404, is "reduced" (demagnified) by a desired factor (e.g., ¼) by the projection-optical system 438 and is focused on the surface of the substrate 408, thereby forming an image of the illuminated portion of the pattern on the substrate 408. So as to be imprintable with the image carried by the patterned beam 406, the upstream-facing surface of the substrate 408 is coated with a suitable resist.

The substrate 408 is mounted by suction or other appropriate mounting force via a "chuck" (not shown but well understood in the art) to a substrate stage 440. The substrate stage 440 is configured to move the substrate chuck (with attached substrate) in the X-direction, Y-direction, and Z-direction (the latter being a focusing direction) relative to the projection-optical system 438. The substrate stage 440 also desirably is operable, as part of an auto-focus system (not detailed) to tilt the substrate 408 relative to the optical axis of the projection-optical system 438 so as to place the substrate surface properly for imaging by the projection-optical system. Desirably, the substrate stage 440 is mounted on and supported by vibration-attenuation devices. The position of the substrate stage 440 is detected interferometrically, in a manner known in the art.

A pre-exhaust chamber 442 (load-lock chamber) is connected to the exposure chamber 428 by a gate valve 444. A vacuum pump 446 is connected to the pre-exhaust chamber 442 and serves to form a vacuum environment inside the pre-exhaust chamber 442.

During a lithographic exposure performed using the system shown in FIG. 8, EUV light is directed by the illumination-optical system 430 onto a selected region of the reflective surface of the reticle 404. As exposure progresses, the reticle 404 and substrate 408 are scanned synchronously (by their respective stages 436, 440) relative to the projection-optical system 438 at a specified velocity ratio determined by the demagnification ratio of the projection-optical system. Normally, because not all the pattern defined by the reticle 404 can be transferred in one "shot," successive portions of the pattern, as defined on the reticle, are transferred to corresponding shot fields on the substrate 408 in a step-and-scan manner. By way of example, a 25 mm×25 mm square chip can be exposed on the substrate 408 with an IC pattern having a 0.07-μm line spacing at the resist on the substrate 408.

Coordinated and controlled operation of the system 400 is achieved using a controller 448 connected to various components of the system such as the illumination-optical system 430, the reticle stage 436, the projection-optical system 438, and the substrate stage 440. For example, the controller 448 operates to optimize the exposure dose on the substrate 408 based on control data produced and routed to the controller from the various components to which the controller 448 is connected, including various sensors and detectors (not shown).

An adaptive-optical element within the scope of the disclosure earlier above can be used, for example, in the projection-optical system 438, which normally comprises four to six EUV-reflective mirrors. In such an embodiment, one or more of the constituent mirrors in the projection-optical system 438 can be an adaptive-optical element, rendering the projection-optical system an adaptive-optical system.

An exemplary mirror as used in a projection-optical system of an EUV lithography system comprises a mirror substrate and a reflective surface having a multilayer configuration as known in the art. For example, the mirror substrate can have a concave surface and the reflective surface can be a multilayer film comprising 50 layer-pairs of Mo and Si having a 69 Å period length. Each period comprises one respective layer of Mo and one respective layer of Si comprising a respective "layer pair." The multilayer film is produced, for example, by ion-beam sputtering.

In an adaptive-optical multilayer-film mirror, the multilayer reflective surface of the mirror can be supported relative to the mirror substrate by the force devices, as shown generally in FIG. 1, for example, in which item 26 is the reflective surface and item 24 is the mirror substrate. Hence, actuation of the force devices 30 changes the surface profile of the multilayer-film reflective surface 26 relative to the mirror substrate 24, as described above.

Typical fabrication processes for microelectronic devices and displays involve multiple lithography steps of respective patterns onto the substrate in a superposed manner. After exposing a pattern of a particular layer onto the substrate surface, alignment of the reticle 404 and substrate 408 should be performed before exposing the subsequent layer. For such a purpose, a reference-mark member (not detailed but understood in the art), defining one or more reference marks, is provided at the substrate plane. Corresponding alignment marks on the reticle plane are aligned with the reference-mark member on the substrate plane, based upon alignment measurements obtained using an alignment tool (not shown) including an alignment sensor (not shown but understood in the art).

The system 400 shown in FIG. 8 can have any of various operational modes. For example, as an alternative to operating in a "step-and-repeat" mode characteristic of steppers, the system 400 can be a scanning-type lithography system operable to expose the pattern from the reticle 404 to the substrate 408 while continuously scanning both the reticle 404 and substrate 408 in a synchronous manner. During such scanning, the reticle 404 and substrate 408 are moved synchronously by their respective stages 436, 440 in opposite directions perpendicular to the Z-axis.

Lithography systems as provided herein are not limited to lithography systems used for manufacturing microelectronic devices. As a first alternative, for example, the system can be a liquid-crystal-device (LCD) lithography apparatus used for exposing a pattern for a liquid-crystal display onto a glass plate. As a second alternative, the lithography system can be used for manufacturing thin-film magnetic heads. In addition, the lithography systems are not limited to systems performing exposures using EUV light. The adaptive-optical elements and systems within the scope of this disclosure are useful with any of various wavelengths of light. Furthermore, as an alternative to use in lithography systems, the adaptive-optical elements and systems within the scope of this disclosure can be used in any of various apparatus such as telescope apparatus.

Either or both the reticle stage 436 and substrate stage 440 can include respective linear motors for achieving the motions of the reticle 404 and substrate 408, respectively, in the X-axis and Y-axis directions. The linear motors can be air-levitation types (employing air bearings) or magnetic-levitation types (employing bearings based on the Lorentz force or a reactance force). Either or both stages 436, 440 can be configured to move along a respective guide or alternatively can be guideless. See U.S. Pat. Nos. 5,623,853 and 5,528,118, incorporated herein by reference.

Further alternatively, either or both stages 436, 440 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 436, 440 as described herein can generate reaction forces that can affect the performance of the lithography system. Reaction forces generated by motion of the substrate stage 440 can be attenuated using vibration-attenuation devices or shunted to the floor (ground) using a frame member as described, e.g., in U.S. Pat. No. 5,528,118, incorporated herein by reference. Reaction forces generated by motion of the reticle stage 436 can be attenuated using vibration-attenuation devices or shunted to the floor (ground) using a frame member as described in U.S. Pat. No. 5,874,820, incorporated herein by reference.

A lithography system such as any of the various types described above can be constructed by assembling together the various subsystems, including any of the optical elements set forth in the appended claims, in a manner ensuring that the prescribed mechanical accuracy, electrical accuracy, and optical accuracy are obtained and maintained. For example, to maintain the various accuracy specifications, before and after assembly, optical-system components and assemblies are adjusted as required to achieve maximal optical accuracy. Similarly, mechanical and electrical systems are adjusted as required to achieve maximal respective accuracies. Assembling the various subsystems into a lithography system requires the making of mechanical interfaces, electrical-circuit wiring connections, and pneumatic plumbing connections as required between the various subsystems. Typically, constituent subsystems are assembled prior to assembling the subsystems into a lithography system. After assembly of the systems, system adjustments are made as required for achieving overall system specifications in accuracy, etc. Assembly at the subsystem and system levels desirably is performed in a clean room where temperature and humidity are controlled.

Figure 9:
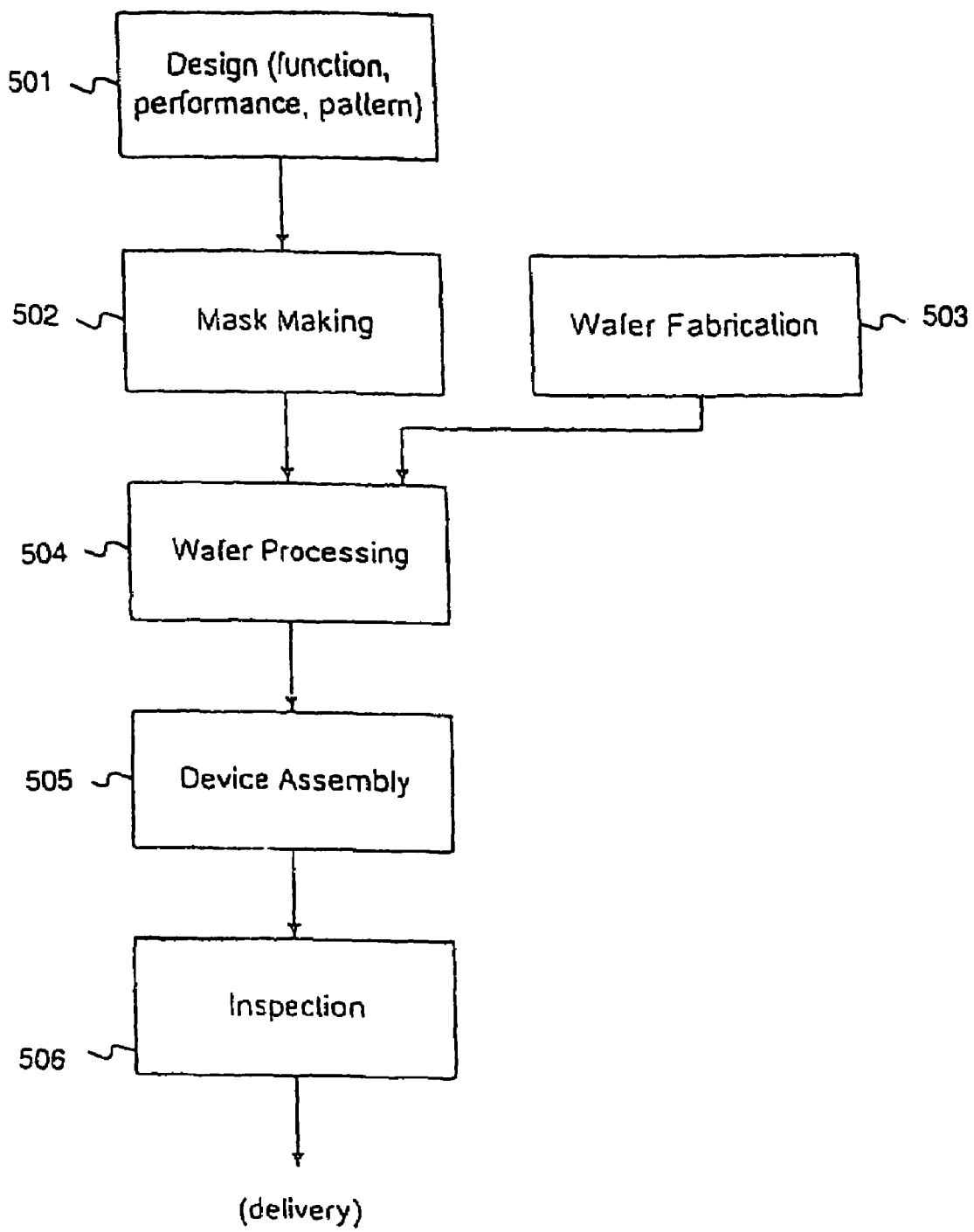
FIG. 9 is a flow chart that outlines a process for manufacturing a device utilizing the lithographic-exposure apparatus of FIG. 8.

Any of various microelectronic devices and displays can be fabricated using a lithography apparatus as described above with respect to FIG. 8. An exemplary process is depicted in FIG. 9. In step 501, the function and performance characteristics of the subject device are designed. Next, in step 502, a mask (reticle) defining a corresponding pattern is designed according to the specifications established in the preceding step. In a parallel step 503 to step 502, a wafer or other suitable substrate is made. In step 504, the reticle pattern designed in step 502 is exposed onto the substrate using a lithography system as described herein. In step 505, the microelectronic device is assembled; this typically includes dicing, bonding, and packaging steps as well known in the art. Finally, in step 506, the devices are inspected.

Figure 10:
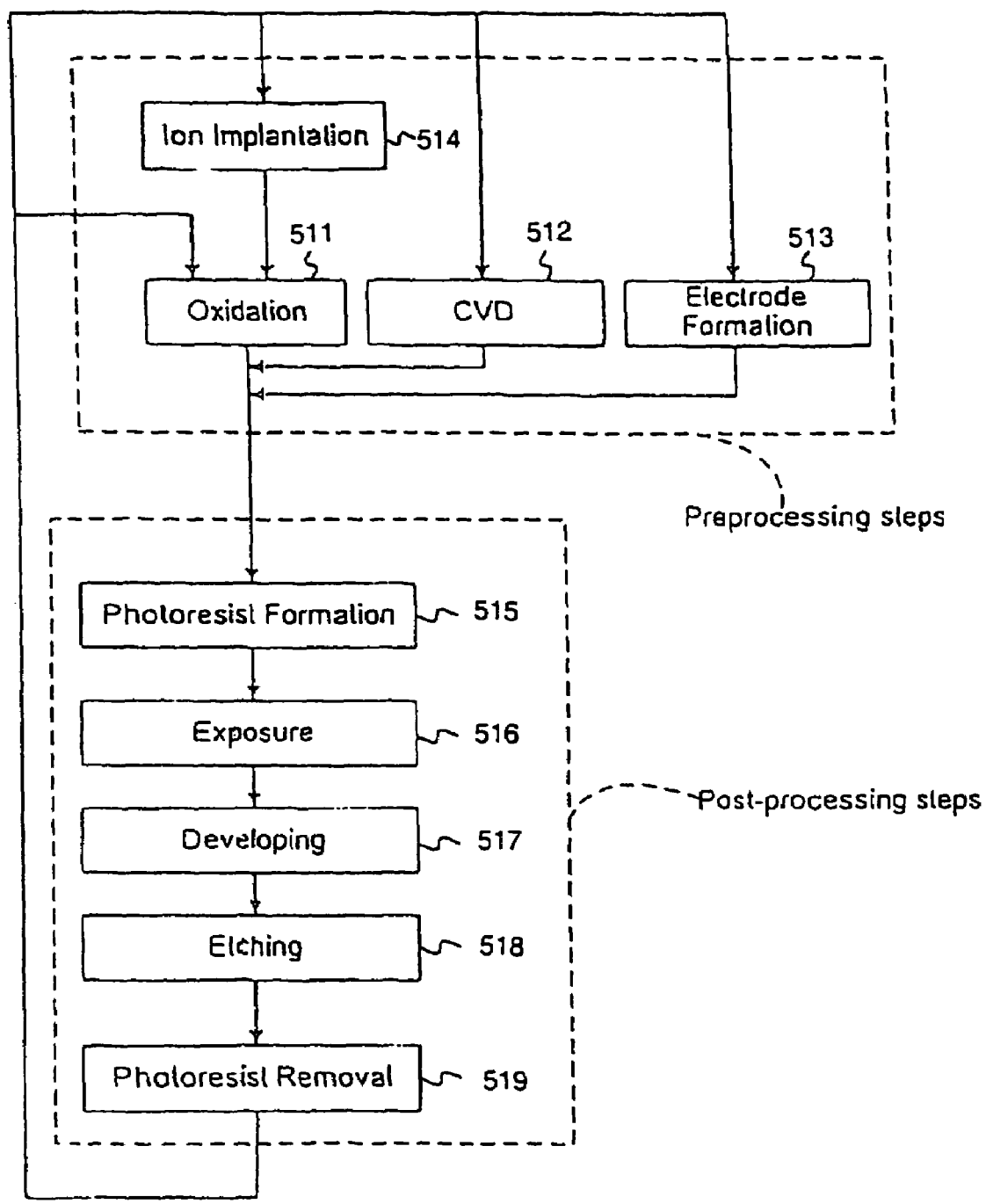
FIG. 10 is a flow chart that outlines certain details of one of the steps in FIG. 9.

FIG. 10 is a flow chart of the details of step 504, as applied to manufacturing microelectronic devices. In step 511 (oxidation), the surface of the substrate is oxidized. In step 512 ("CVD" or chemical vapor deposition), an insulating film is formed on the substrate surface. In step 513 (electrode formation), electrodes are formed on the substrate by vapor deposition. In step 514 (ion implantation), ions are implanted in the substrate. These steps 511–514 constitute the "pre-process" steps for substrates during substrate processing; during these steps selections are made as required according to processing requirements.

Continuing further with FIG. 10, at each stage of substrate processing, after the above-mentioned pre-process steps are completed, the following "post-process" steps are executed. Initially, in step 515 (photoresist formation), a layer of a suitable resist is applied to the substrate surface. Next, in step 516 (exposure), the lithography system is used to transfer the circuit pattern defined by the reticle to the substrate. In step 517 (developing), the exposed layer of resist on the substrate surface is developed. In step 518 (etching), portions of the substrate surface not protected by residual resist are removed by etching. In step 519 (photoresist removal), any resist remaining after completing the etching step is removed.

Multiple circuit patterns are formed on the substrate surface by repeating these pre-process and post-process steps as required.

In view of the many possible embodiments to which the principles of the invention can be applied, it should be recognized that the illustrated embodiments are only representative examples of the invention and should not be taken as a limitation on the scope of the invention. For example, the principles of the invention as described above can be used with any of various other systems, including (but not limited to) other microelectronic-processing systems, inspection apparatus, telescopic apparatus, or other optical apparatus using adaptive optics.

Moreover, for purposes of this disclosure, the term "adaptive" (as used, for example, in the phrases "adaptive optics" or "adaptive mirror") refers generally to the field of using a deformable surface of an optical element to improve the optical characteristics of reflected wavefronts. Thus, no distinction should be drawn between "adaptive optics" and "active optics," as the scope of the present invention encompasses both fields. The invention is further intended to encompass all modifications, alternatives, and equivalents as may be included within the spirit and scope of the invention, as defined by the appended claims.

What is claimed is:

1. An optical element for use in an adaptive-optical system, the optical element comprising:
   a deformable optical surface;
   an array of force devices coupled to the optical surface, each force device being configured, when actuated, to exert a respective force on a respective locus of the optical surface that imparts a respective localized deformation of the optical surface such that actuation of the force devices collectively forms the optical surface into a desired shape, the force devices being arranged into multiple sets, each force device being a member of a designated first set and a designated second set that is different from the first set;
   at least one force controller coupled to the force devices of a respective first set and configured to cause, when activated, the force devices of the respective first set to apply respective forces to the respective loci; and
   at least one braking controller coupled to the force devices of a respective second set and configured to prevent, when activated, a change in force exerted by the force devices of the respective second set and by at least one force device of the first set.

2. The optical element of claim 1, wherein:
   each force device comprises a respective movable member;

the at least one force controller is configured to cause, when activated, the movable members of the force devices of the respective first set to apply respective forces to the respective loci; and the at least one braking controller is configured to prevent, when activated, a change in force exerted by the movable members of the force devices of the respective second set and by the movable member of at least one force device of the first set.

3. The optical element of claim 1, wherein the first set and second set are arrayed rectilinearly with respect to each other.

4. The optical element of claim 3, wherein each force device comprises a respective movable member that is actuated and braked by a respective combination of a force controller and a braking controller that is unique for each force device.

5. The optical element of claim 3, comprising multiple first sets and multiple second sets of force devices, wherein each first set is actuated by a respective force controller and each second set is braked by a respective braking controller.

6. The optical element of claim 5, wherein:
each first set and each second set comprises multiple respective force devices; and
the number of force controllers is less than the number of force devices.

7. The optical element of claim 6, wherein the number of force controllers and braking controllers is less than the number of force devices.

8. The optical element of claim 1, wherein each force device comprises a respective piston situated in and movable with respect to a respective cylinder.

9. The optical element of claim 1, wherein each force device is electrically actuated.

10. The optical element of claim 1, wherein each force device is hydraulically actuated.

11. The optical element of claim 1, wherein each force device is pneumatically actuated.

12. The optical element of claim 1, wherein each force device is magnetically braked by a respective braking controller.

13. The optical element of claim 12, wherein the respective braking controller applies a magnetic field to the force device, the magnetic field having a direction that is at a right angle to a force axis of the force device.

14. The optical element of claim 1, wherein the force devices are electrically braked by respective braking controllers.

15. The optical element of claim 1, wherein the force devices are hydraulically braked by the-respective braking controllers.

16. The optical element of claim 1, wherein the force devices are pneumatically braked by the-respective braking controllers.

17. The optical element of claim 1, configured as a mirror, wherein the deformable optical surface is a reflective surface of the mirror.

18. An optical system, comprising an adaptive-optical element, the adaptive-optical element comprising:

a deformable optical surface;

an array of force devices coupled to the optical surface, each force device comprising a respective movable member that is configured, when actuated, to exert a respective force on a respective locus of the optical surface that imparts a respective localized deformation of the optical surface such that actuation of the force devices collectively forms the optical surface into a desired shape, the force devices being arranged into multiple sets, each force device being a member of a designated first set and a designated second set that is different from the first set;

at least one force controller coupled to the force devices of a respective first set and configured to cause, when activated, the movable members of the force devices of the respective first set to apply respective forces to the respective loci; and at least one braking controller coupled to the force devices of a respective second set and configured to prevent, when activated, a change in force exerted by the movable members of the force devices of the respective second set and by the movable member of at least one force device of the first set.

19. A lithographic exposure system, comprising an optical system as recited in claim 18.

20. The lithographic exposure system of claim 19, configured for using a beam of extreme ultraviolet light as a lithographic exposure light.

21. An optical system, comprising an adaptive-optical element, the adaptive-optical element comprising:

a deformable optical surface;

an array of force devices coupled to the optical surface and configured to exert respective forces on the optical surface that impart respective localized deformations of the optical surface so as collectively to form the optical surface into a desired shape, the force devices being arranged into braking groups and force-altering groups, each force device being a member of a designated braking group and a designated force-altering group;

at least one force controller coupled to the force devices of a respective force-altering group and configured to cause the force devices of the respective force-altering group to apply respective forces to respective loci of the optical surface so as to deform the optical surface; and at least one braking controller coupled to the force devices of a respective braking group and configured to prevent, when activated, a change in the respective forces applied by the respective force devices of the respective braking group when the braking controller is activated.

22. A lithographic exposure system, comprising an optical system as recited in claim 21.

23. The lithographic exposure system of claim 22, configured for using a beam of extreme ultraviolet light as a lithographic exposure light.

* * * * *